(12) United States Patent
Lowe, Jr. et al.

(10) Patent No.: US 10,056,314 B2
(45) Date of Patent: *Aug. 21, 2018

(54) POLYMER THERMAL INTERFACE MATERIAL HAVING ENHANCED THERMAL CONDUCTIVITY

(71) Applicant: INTEL CORPORATION, Santa Clara, CA (US)

(72) Inventors: Randall D. Lowe, Jr., Chandler, AZ (US); Syadwad Jain, Chandler, AZ (US); James C. Matayabas, Jr., Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/736,120

(22) Filed: Jun. 10, 2015

(65) Prior Publication Data

US 2015/0279762 A1    Oct. 1, 2015

Related U.S. Application Data

(63) Continuation of application No. 13/844,243, filed on Mar. 15, 2013, now Pat. No. 9,070,660.

(51) Int. Cl.

| | |
|---|---|
| *H01L 23/373* | (2006.01) |
| *C08L 83/04* | (2006.01) |
| *C09C 3/12* | (2006.01) |
| *H01L 23/367* | (2006.01) |
| *H01L 23/42* | (2006.01) |
| *B32B 5/16* | (2006.01) |
| *C08K 3/22* | (2006.01) |
| *C08K 3/08* | (2006.01) |
| *C08K 3/28* | (2006.01) |

(52) U.S. Cl.
CPC .......... *H01L 23/3737* (2013.01); *C08L 83/04* (2013.01); *C09C 3/12* (2013.01); *H01L 23/3672* (2013.01); *H01L 23/3675* (2013.01); *H01L 23/3736* (2013.01); *H01L 23/42* (2013.01); *B32B 5/16* (2013.01); *C08K 2003/085* (2013.01); *C08K 2003/0806* (2013.01); *C08K 2003/0812* (2013.01); *C08K 2003/2227* (2013.01); *C08K 2003/2296* (2013.01); *C08K 2003/282* (2013.01); *H01L 2224/16225* (2013.01); *H01L 2224/73253* (2013.01); *H01L 2924/15311* (2013.01); *H01L 2924/16152* (2013.01)

(58) Field of Classification Search
CPC .. C09C 3/00; C09C 3/12; C09C 1/043; C09C 1/3081; C09C 1/407; C09C 1/644; C08L 83/04
See application file for complete search history.

(56) References Cited

U.S. PATENT DOCUMENTS

| | | | |
|---|---|---|---|
| 7,329,706 B2 | 2/2008 | Fukui et al. | |
| 9,070,660 B2* | 6/2015 | Lowe, Jr. | ............ H01L 23/3737 |
| 2013/0082369 A1* | 4/2013 | Kokubo | ................ H01L 23/296 |
| | | | 257/666 |

FOREIGN PATENT DOCUMENTS

WO   WO-2012/102852 A1   8/2012

* cited by examiner

*Primary Examiner* — Marc S Zimmer
(74) *Attorney, Agent, or Firm* — Schwabe, Williamson & Wyatt, P.C.

(57) ABSTRACT

A polymer thermal interface material is described that has enhanced thermal conductivity. In one example, a vinyl-terminated silicone oil is combined with a silicone chain extender, and a thermally conductive filler comprising at least 85% by weight of the material, and comprising surface wetted particles with a range of shapes and sizes. The material may be used for bonding components inside a microelectronic package, for example.

13 Claims, 6 Drawing Sheets

POLYMER THERMAL INTERFACE MATERIAL HAVING ENHANCED THERMAL CONDUCTIVITY

CROSS-REFERENCE TO RELATED APPLICATION

The application is a continuation of co-pending U.S. patent application Ser. No. 13/844,243, filed Mar. 15, 2013 and incorporated herein by reference.

FIELD

The present description relates to thermal adhesives for micro-electronic and mechanical packaging and in particular to thermal adhesives that combine polymers with a conductive filler.

BACKGROUND

In the assembly of semiconductor packages, greases, fillers and adhesives are used to attach covers and heat sinks to completed dies and to attach different parts of a package to each other. Because a semiconductor die heats with use, the different parts of a package, including the die will expand and contract. Any adhesive must allow for this expansion and contraction. As a result, greases and polymers are often used between parts. On the other hand, heat must be conducted away from the die so that it does not overheat during use. Greases and polymers are very poor heat conductors, but most heat conductors do not accommodate expansion and contraction between parts of the package.

Thermal interface materials (TIMs) are used to attach heat spreaders to a die and to attach heat sinks to a package. TIMs are designed to balance adhesion, flexibility, heat conductance, thermal stability, ease of use, and cost, among other factors. A variety of different formulations have been developed for different applications that feature different characteristics.

The thermal performance of the current polymer thermal interface material (PTIM) limits its use in products with demanding thermal targets. The heat flux through the silicon die in future products during operation is expected to increase as the sizes of transistors shrink and more transistors are packed into a given area. Solder thermal interface materials (STIMs) are used in products requiring more efficient heat removal than can be accomplished with current PTIMs, but STIMs are more expensive. Indium is a common ingredient in STIMs and the price of indium continues to increase. STIM also requires flux to apply, integrated heat spreaders with gold plating to connect with the solder, and silicon dies with backside metallization to connect with the solder.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
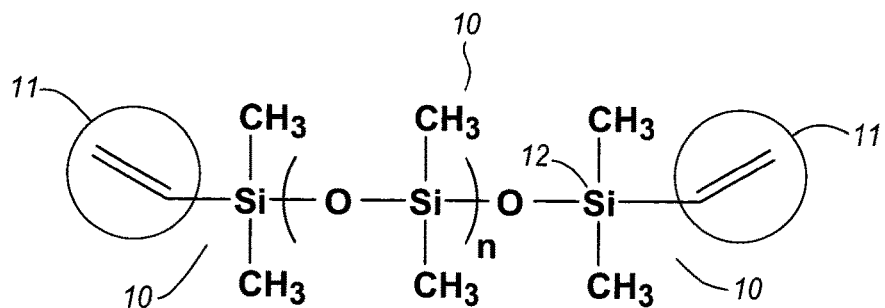
FIG. 1 is a diagram of a vinyl-terminated silicone according to an embodiment of the invention.

As described herein a new PTIM may be made that has better thermal performance. This provides benefits in products that already use PTIM and also may allow some products that use the more expensive STIM to be made using PTIM. Furthermore, this PTIM exhibits little or no voiding after curing so that the thermal performance is not reduced in a microelectronic package. In addition, the materials do not significantly degrade during reliability testing.

General Composition

The new PTIM described herein exhibits better package-level thermal performance and less voiding. In some embodiments, a new composition is used for a PTIM with a bulk thermal conductivity greater than 5 W/m/K. This may be done using thermally conductive fillers for improved heat transfer by conduction. The volatile content may be less than 0.2 weight percent at 150° C. due to a low volatile wetting agent for reduced voiding. The shear storage modulus, G', after curing may be less than 15 kPa due to reduced crosslinking in the PTIM. Additional chain extender may be used for reduced interfacial contact resistance. The adhesion to the oxide surfaces is also increased by adding an adhesion promoter for improved reliability.

The table shows features of a composition of a PTIM that provides higher performance as described above. The values are provided in approximate ranges because the actual weight percentages may vary depending on the amounts and the molecular weights of the ingredients used.

TABLE

| Component | Composition by weight % |
| --- | --- |
| Thermally Conductive Fillers | >85% |
| Vinyl-terminated silicones | 3-15% |
| Chain Extenders | 0.1-3% |
| Crosslinkers | 0.1-3% |
| Surface Wetting Agents | 0.1-3% |
| Adhesion Promoters | 0.1-3% |
| Other Additives | 0.1-3% |

Filler Particles

The thermally conductive filler particles may be used to increase and to modulate the bulk thermal conductivity of the PTIM. The filler loading in the PTIM may be as high as or higher than 85 weight % to achieve high thermal conductivity. In some examples, the thermal conductivity is more than 5 W/m/K. Filler particle materials may include but are not limited to any of the following or combinations of the following materials: metals and metal alloys such as aluminum, copper, or silver; ceramics and oxidized metals such as zinc oxide, aluminum oxide, aluminum nitride, and boron nitride; and carbon-based materials such as graphite. Examples of thermally conductive filler particle sizes suitable for PTIMs in microelectronic packaging applications may include but are not limited to average particle diameters in the 8-10 µm range and maximum particle sizes of approximately 40 µm. However, a range of particle size and shape distributions may be used to suit different applications.

Silicone Oil

Vinyl-terminated silicones may be used to participate in crosslinking reactions with other silicones. In a formulation that contains silyl hydride groups such as a crosslinker and a chain extender, cross linking reactions are caused via platinum-catalyzed hydrosilylation. A general formula for a vinyl-terminated silicone oil suitable for use with the described PTIM is shown in FIG. 1.

In the example of FIG. 1, a silicone oil component has pendant functional methyl groups 10 attached to the Si atoms 12 of the vinyl-terminated silicone. The structure includes at least one unit of Oxygen-Silicon (O—Si) and a plurality of hydrocarbons to make up the silicon oil and vinyl groups. The O—Si group in parenthesis represents a polymer. The subscript "n" to the polymer is the degree of polymerization and represents a polymer chain of the structure component 10 where "n" is in the range of 10-1000 (i.e., when "n" is equal to 10, the average length of the polymer chain is 10).

The silicone-oil base (i.e., O—Si—O—Si with hydrocarbons) when combined with vinyl (e.g., CH double bond (=) $CH_2$ or $CH_3$) form a vinyl-terminated silicone. The vinyl groups are at the ends of the polymer chain and terminated by open double bonds 11. The vinyl-termination of the silicone oil is denoted by the symbol "$H_2C=CH—$" or "$—CH=CH_2$". The structure of FIG. 1 is not terminated but shows open double bonds to allow it to bond with silyl hydride groups or other materials in the PTIM.

The pendant groups are not limited to methyl groups and longer alkyl chains, aromatic groups, and non-carbon heteroatom-containing functional groups may also be used. In the example of FIG. 1, n represents the number of repeating pendant groups in the chain. These pendant groups can be tuned to modify the intermolecular interactions between polymer chains and between treated filler particles to tailor bulk properties such as the modulus and viscosity. The molecular weight of the silicone oil can also be tuned to modulate the viscosity of the resulting PTIM in order to suit particular applications. The low molecular weight species can also be lowered to reduce the overall volatile content of the PTIM and reduce the risk of voiding.

Crosslinkers

Figure 2:
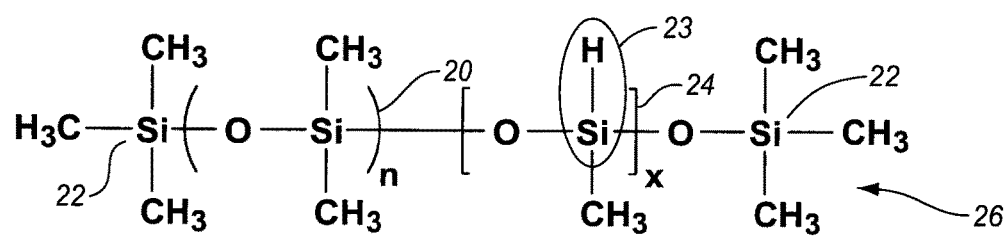
FIG. 2 is a diagram of a silicone crosslinker according to an embodiment of the invention.

Crosslinkers such as silicone crosslinkers containing silyl hydride functional groups may also be included. An example of a generic silyl-hydride containing crosslinker is shown in FIG. 2. Pendant functional groups are shown as methyl groups 20 attached to silicon atoms 22. The crosslinkers may include functional groups other than methyl groups to tailor the interactions and properties of the resulting material as noted above for the vinyl-terminated silicones.

The structure component is a silicone oil based composition with at least one unit of Oxygen-Silicon (O—Si) 20 and plurality of hydrocarbons to make up the silicone oil and silyl hydride groups. In FIG. 2, the O—Si group 20 in parenthesis represents a polymer. The subscript "n" to the polymer is the degree of polymerization and represents a polymer chain of the structure component. The silicone-oil base (i.e., O—Si—O—Si with hydrocarbons) when combined with Si—H (e.g., Si bonded to $CH_3$ and Si bonded to H 23 form a silicone crosslinker. =Silyl hydride groups 23 (Si—H) are able to react with vinyl-terminated silicones via hydrosilylation. The degree of crosslinking can be modulated by changing the number, x, of silyl hydride groups on the crosslinker. In one example, the average number of silyl hydride groups per crosslinker molecule is three, but crosslinkers with greater numbers of silyl hydride groups may be used depending on the application. The crosslinkers may also contain functional groups such as silanes 26 or epoxides that can react with the surfaces of silicon die and integrated heat spreaders for improved adhesion and wetting as discussed in the adhesion promoter section below. The molecular weights of the crosslinkers can be tuned to modulate the viscosity. The crosslinker may be purified to remove low molecular weight species to maintain low volatile content in the PTIM.

As shown in FIG. 2 a silicone crosslinker may contain silyl hydride functional groups 24 that can react with vinyl groups 10 on the vinyl-terminated silicone, where n and x represent the number of repeating units, respectively.

Chain Extenders

Chain extenders may be used in either single or multiple chain extender forms to control properties such as the modulus and elongation of the cured material. In one example, the chain extenders possess terminal silyl hydride functional groups that undergo hydrosilylation reactions with the vinyl-terminated silicone to form linear polymers. An example of a silyl hydride-terminated chain extender is shown as a formula in FIG. 3.

The structure component 30 (e.g., the chain extender) includes a silicone oil based material, which is represented by the parenthesis with the subscript "n" (where "n" is the degree of polymerization) and Si—H/H—Si (silicone hydrate) at two ends of the silicone oil (e.g., O—Si—O—Si—O—Si, etc., chain structure). The chain extender or structure component 30 may be long or short depending on the number of polymer (O—Si) composition used in the structure. In other words, the degree of polymerization of the chain extender "n" used can range from approximately 10 to approximately 10,000. The structure component 30 (H-terminated silicone oil) may be used as a chain extender for the polymer chain described in FIG. 1. The two hydrogen (H) components 33 are located at the two ends of the silicone oil based material (O—Si—O—Si chain). The chain extender also includes a plurality of hydrocarbons $CH_3$. The chain extender is combined with the vinyl-terminated silicone oil to control the modulus (i.e., shear modulus G') of the PTIM as described herein.

Modulus control can be achieved by varying the amount of the chain extenders in the PTIM relative to the amount of the crosslinkers from 0% to 100% to modulate the amount of linear polymer that is formed relative to the crosslinked polymer. The modulus can be controlled to affect the interfacial contact resistance of the PTIM. Decreasing the modulus excessively can increase the risk of pumping out the fillers during reliability testing. Using the described compositions, the shear storage modulus may be between 1-15 kPa. In one example the shear storage modulus is approximately 6 kPa. The molecular weights of the chain extenders can be tuned to modulate the viscosity, and low molecular weight species may be removed via purification for a low volatile content in the PTIM.

Figure 3:
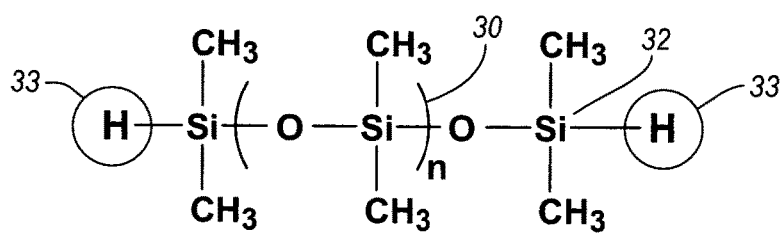
FIG. 3 is a diagram of a silyl hydride-terminated chain extender according to an embodiment of the invention.

FIG. 3 shows a silyl hydride-terminated chain extender, where n represents the number of repeating units 30. The pendant functional groups attached to the silicon atoms 32 on the crosslinkers and chain extenders may include functional groups other than methyl groups to tailor the interactions and properties of the PTIM as noted above for the vinyl-terminated silicones.

The molar ratio of Si—H to Si-Vinyl may also be varied to suit a particular application. The molar ratio of total Si—H groups from the crosslinkers and the chain extenders to the Si-vinyl groups on the vinyl-terminated silicones may be in the range of about 0.8-1.2, such as for example 1:1. This range tends to mitigate the risk of additional crosslinking reactions occurring after curing the PTIM in microelectronic packages. Additional crosslinking reactions in the PTIM can result in a modulus that is unstable and changes during use conditions, which can alter the thermal performance of the PTIM.

Surface Wetting Agents

Surface wetting agents are used to treat the filler particles. This promotes interactions between the fillers and the silicone polymer matrix to aid in the uniform dispersion of the fillers and to mitigate oxidation of the filler particles. The filler treatments can also modify the bulk properties of the PTIM such as the modulus and the viscosity. Filler particle treatments may include but are not limited to monomeric, oligomeric, and polymeric chemical agents containing mono, bi, or trifunctional silane groups. These silane groups may include but are not limited to: chloro, methoxy, ethoxy, isopropoxy, and acetoxy groups. The fillers may be pre-treated before PTIM formulation occurs, or the fillers may be treated in situ during PTIM formulation. A combination of these treatment methods may also be used.

Candidates for the surface wetting agent may include, but are not limited to, any of the C1-C26 alkylsilanes such as: methyl-, hexyl-, octyl-, decyl-, dodecyl-, and hexadecyl-trimethoxysilanes. Agents other than alkylsilanes may also or alternatively be used. For example, the silane wetting agent may present cyclic rings as in phenyltrimethoxysilane and non-carbon hetero atoms as in glycidoxypropylt-rimethoxysilane. FIG. 3 shows formulas for examples of potential surface wetting agents.

Surface wetting agents with boiling points above the curing temperature of the PTIM may be used if the amount of wetting agent in the PTIM formulation exceeds the amount required to coat the surfaces of the filler particles as is often the case. Excess wetting agent will be present in the PTIM as free or non-adsorbed molecules that can vaporize while the PTIM is being cured. Depending on the temperature and vapor pressure of the wetting agent the vaporized molecules will cause voids in the PTIM. The use of wetting agents with boiling points greater than the curing temperature will keep the volatile content of the PTIM low at relevant temperatures of curing and operation and will reduce the risk of void formation. Voids in the cured PTIM can decrease the thermal performance because the gases occupying the voids inherently have very low thermal conductivities. According to some embodiments, the volatile content of the PTIM at 150° C. is lowered three to four times by using a less volatile wetting agent.

Figure 4A:
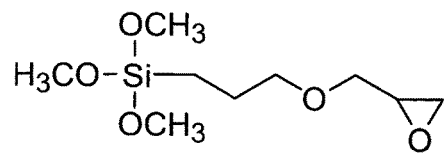
FIG. 4A is a diagram of a first wetting agent according to an embodiment of the invention.
Figure 4B:
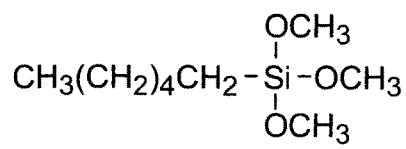
FIG. 4B is a diagram of a second wetting agent according to an embodiment of the invention.
Figure 4C:
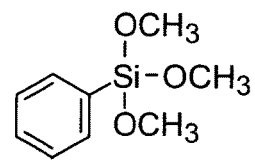
FIG. 4C is a diagram of a third wetting agent according to an embodiment of the invention.
Figure 4D:
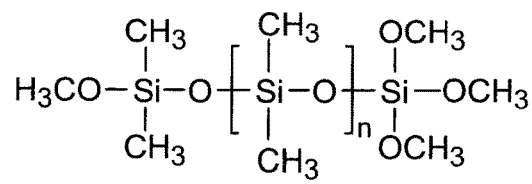
FIG. 4D is a diagram of a fourth wetting agent according to an embodiment of the invention.

FIGS. 4A to 4D show formulas for examples of wetting agents that may be used. Other wetting agents may also be used instead of or in addition to those shown. FIG. 4A shows a glycidoxypropyltrimethoxysilane. FIG. 4B shows a hex-yltrimethoxysilane. FIG. 4C shows a phenyltrimethoxysilane. FIG. 4D shows a trimethoxysilane-terminated silicone oligomer or polymer depending on the degree of polymerization, n.

PTIM formulations have been prepared using a wetter that boils above the curing temperature. This results in less PTIM voiding. However, increasing the boiling point of the wetter may involve increasing its molecular weight, which may increase the G' and viscosity. In addition, significant increases in G' can adversely affect the thermal performance of the PTIM.

By using a multi-component wetter system, voiding in the PTIM can be reduced while maintaining a low enough shear storage modulus (G') to maintain acceptable thermal performance and to keep the PTIM properties within optimal specifications. With some wetters, after the wetter is used to coat the surfaces of the filler particles, excess wetter remains in the PTIM formulation. This excess wetter is above the amount required to coat the filler particles. It reduces the viscosity and the G' and promotes interactions between the bulk PTIM and the surfaces of the IHS and silicon die.

The excess, 'free' wetter that is not adsorbed onto filler particles may increase the risk of voiding in the PTIM because the boiling point of the wetter is less than the curing temperature that is used. Gas bubbles generated from the volatilized wetter may become trapped in the PTIM during curing. This may result in the observation of voids and reduced thermal performance.

Simply replacing the wetter with a higher-boiling wetter may reduce volatilization of the non-adsorbed wetter, but this approach has the downside of increasing the G' and viscosity of the PTIM which can adversely affect the thermal performance. A multi-component wetter system may be used to reduce volatile content at the curing temperature. This may reduce voiding while maintaining optimal bulk properties in the PTIM (G', viscosity).

A multi-component wetter system allows the volatile content within the PTIM to be reduced thereby reducing the voiding risk. The bulk and interfacial properties of the PTIM may be independently controlled to improve the thermal performance of the PTIM. The wetter may be designed to provide several functions in the PTIM. One function is to adsorb onto the filler particles and form a coating. The coating aids with the dispersion of the filler particles into the silicone matrix and to protect the particles from oxidation. The adsorbed wetter coating also protects the cross-linker from interacting with the aluminum filler surfaces and degrading. The wetter may also promote interactions between the bulk silicone and the surfaces of the silicon die and the IHS surfaces. On the other hand, as mentioned above, non-adsorbed, excess wetter may reduce the G' and viscosity of the PTIM. However, some excess wetter promotes wetting of the PTIM to the oxide surfaces of the die and the IHS In addition, replacing the wetter with a wetter that has a higher-boiling point will increase the G' and the viscosity. This may cause stronger intermolecular forces between wetter molecules adsorbed onto the filler particles and the bulk silicone when the higher-boiling point wetter is used. However, the Increased G' may decrease the thermal performance and increase the risk of corner delamination. Increasing the viscosity can increase the bond line thickness (BLT), and it can make the PTIM difficult to dispense.

With respect to creating voids during curing, a primary factor is the amount of volatile content that turns to gas during curing. A second wetter may be added that boils above the curing temperature without increasing the number of or possibility for voids. In this way the amount of 'free' or non-adsorbed wetter can be increased without increasing the amount of volatile content that can form bubbles during curing.

In some embodiments, the multi-component wetter system starts with enough of a low temperature wetter to form a monomolecular layer of adsorbed wetter molecules on the surfaces of the filler particles in the PTIM. The wetter is low temperature because the wetter will bubble at the curing temperature. However, the wetter molecules that are adsorbed are nonvolatile at the curing temperature. This is because they are bonded to the filler particles. If the amount of low temperature wetter is low, then all or most of it will be adsorbed. The bonding allows wetter molecules that are volatile in their non-adsorbed form to be used. These wetter molecules maintain weak interactions between the filler and the bulk silicone for lower G' and lower viscosity.

The amount of low temperature wetter is selected to be about enough to coat the filler particles. This can be calculated or determined empirically. In embodiments, as much wetter is used as possible without there being any excess.

Next, a second high temperature wetter, that is a wetter with a boiling point above the curing temperature (165° C.) is added to the PTIM formulation. This wetter brings the G' and the viscosity back down to within desired performance limits. The second wetter promotes interactions between the bulk silicone of the PTIM and the surfaces of the silicon die and the IHS for improved wetting. The second wetter does this without raising the volatile content at the curing temperature due to its higher boiling point.

The first low temperature wetter may be any of the wetters described above. The high temperature wetter may take any of a variety of different forms. One example is described below. A conceptual composition of a proposed PTIM with a multi-component wetter may include silicon oil, filler particles, two or more wetters, a chain extender and crosslinker, a catalyst, an inhibitor and other additives.

The silicone oil may be used as the backbone of the polymer matrix and contains vinyl groups that participate in the polymerization reaction. The filler particles are thermally conductive to impart thermal performance to the composition.

The first wetter coats the surfaces of the filler particles. The filler particles are treated with the first wetter to facilitate their uniform distribution into the polymer matrix. A variety of different wetters may be used such as low-boiling point alkylsilane (boiling point of about 100° C.). This wetter is nonvolatile at relevant curing temperatures after it has been chemisorbed to the filler surface. It will boil when non-adsorbed or free.

The second wetter boils above the curing temperature to reduce the risk of voiding. The second wetter promotes interactions between the bulk silicone and the surfaces of the IHS and silicon die.

The chain extender and crosslinker contains Si—H groups for reactions with vinyl groups in the silicone oil. The modulus of the PTIM can be tailored by manipulating the ratio of the crosslinker to the chain extender. The catalyst tunes the polymerization kinetics for a predictable cure. The inhibitor is added to improve the pot life and shelf life of the PTIM. Other additives may also be used, depending on the particular implementation.

Figure 4E:
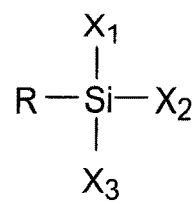
FIG. 4E is a diagram of a fifth wetting agent according to an embodiment of the invention.

An example of a high-boiling, second wetter is shown in FIG. 4E. FIG. 4E is a diagram of a chemical structure of a general silane molecule that could function as the second wetter in the multi-component system. R may include, but is not limited to, any of the C6-C26 alkyl chains such as: hexyl-, octyl-, decyl-, dodecyl-, and hexadecyl-trimethoxysilanes. In addition to, or instead of, alkylsilances, R may include cyclic rings and non-carbon hetero atoms such as nitrogen and oxygen. For example, phenyltrimethoxysilane is a potential candidate since it boils above the curing temperature.

X1, X2, and X3 may represent, but are not limited to, any combination of hydrolyzable chloro or alkoxy groups, and they may also represent any combination of hydrolyzable and non-hydrolyzable chemical functional groups as long as one of them remains hydrolyzable for reactions with oxide surfaces.

In summary, the reduced volatile content achieved by using a combination of two different wetters reduces the risk of voiding from the entrapment of gas bubbles during curing. The second wetter may be mixed into the PTIM in the same way as the first wetter. The lower amount of the first wetter is more difficult to mix due to the higher viscosity, but this is overcome when the second wetter is added. The volatility of the components may be controlled by advance preparation such as by distilling or the volatile components of any type may be reduced using vacuum, elevated temperature or other approaches. This may be done before or after the filler particles are added. The volatility of all of the components of any PTIM described herein may be reduced for enhanced solder performance.

Adhesion Promotors

Adhesion promoters may be added to the PTIM to improve the interfacial adhesion and wetting of the PTIM to the surfaces it contacts. For a typical package, the PTIM adheres on one side to an oxide surface of a silicon die. The other side adheres to an integrated heat spreader surface typically formed of a thermally conductive metal or graphite material that may have a surface oxide. In other applications, the PTIM may adhere to other materials.

Adhesion promoters may include excess amounts of the same filler treatments described above, but they are more likely to include different chemicals specifically targeted to form more robust interactions such as covalent bonds between the bulk PTIM and the silicon die and IHS (Integrated Heat Spreader) surfaces or other metallic surfaces that it contacts. Adhesion promoters may include but are not limited to monomolecular, oligomeric, or polymeric materials that possess chemical functional groups that can react with the surfaces of a silicon die and an IHS. Examples of these surface-reactive groups include but are not limited to: mono, bi, and trifunctional silanes; thiols, and carboxylic acids. In addition to functional groups designed for bonding to the silicon die and to IHS surfaces, the adhesion promoters may also possess functional groups that can undergo ideally covalent and/or robust intermolecular interactions with the polymer matrix of a bulk TIM or sealant material.

Specific examples of adhesion promoters may include but are not limited to vinyltrimethoxysilane and silyl hydride- or vinyl-containing PDMS (polydimethylsiloxane) molecules with surface active functional groups such as silane or epoxide groups. The adhesion promoter should ideally play dual roles in crosslinking into the silicone polymer and in covalently and/or hydrogen bonding to the oxide surfaces that the PTIM contacts in microelectronic packages. In some cases, the crosslinker and the adhesion promoter may be the same additive, depending on the particular embodiment. As with many of the other components, by selecting adhesive promoters with boiling points that are greater than the curing temperature of the PTIM, fewer voids are produced during cure.

Figure 5A:
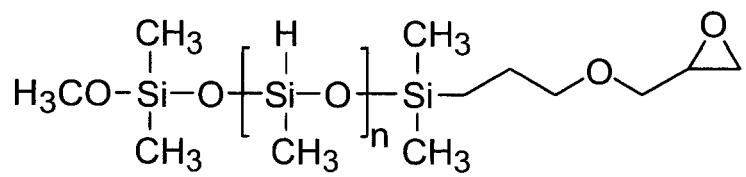
FIG. 5A is a diagram of a first adhesion promoter according to an embodiment of the invention.
Figure 5B:
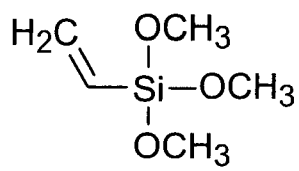
FIG. 5B is a diagram of a second adhesion promoter according to an embodiment of the invention.
Figure 5C:
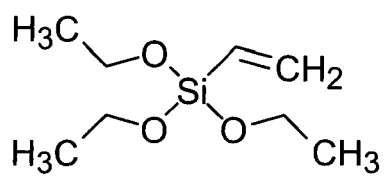
FIG. 5C is a diagram of a third adhesion promoter according to an embodiment of the invention.
Figure 5D:
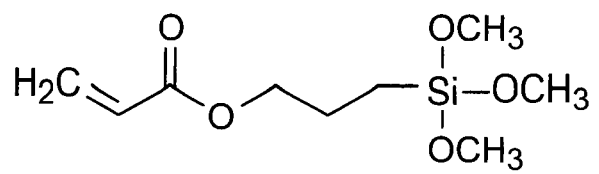
FIG. 5D is a diagram of a fourth adhesion promoter according to an embodiment of the invention.

FIGS. 5A to 5D show examples of adhesion promoters. These are provided as examples only and many others may also or alternatively be used. FIG. 5A shows a silicone oligomer or polymer depending on the degree of polymerization, n, that contains an epoxide group for adhesion and silyl hydride groups for crosslinking FIG. 5B shows a vinyltrimethoxysilane. FIG. 5C shows a vinyltriethoxysilane. FIG. 5D shows an acryloxypropyltrimethoxysilane.

Other Components and Application

In addition to the materials shown in the Table, other additives may also be included in a PTIM. These additives may include catalysts, inhibitors, solvents, coloring agents, and other components, depending on the particular implementation.

The PTIM described herein may be formulated by mixing the components together to produce a gel which may be applied by dispensing methods to any particular surface and cured at a certain temperature (i.e., room temperature to cure oven at 150° C. to 25° C.). The PTIM formulation includes at least one vinyl-terminated silicone oil, at least one H-terminated silicone oil (e.g., a chain extender), at least one silicone crosslinker (i.e., Si—H crosslinker), and at least one thermally conductive filler with an applied surface wetting agent. These structure components are combined together to form a low modulus PTIM formulation. The order of the compositions that are combined together is not critical to the formation of the PTIM. Other additives such as catalysts for the curing reaction may also be included in the compositions. The ratio of Si—H equivalents from the chain extender to the Si—H equivalents from the crosslinker may be adjusted to achieve a desired modulus value and other characteristics.

The crosslinking reaction that occurs during cure involves the formation of a silicon-carbon bond by reaction of the vinyl group with the silicon hydride group. The Si—H to Si-vinyl molar ratio may be adjusted to control the properties of the silicone matrix after cure. However, a wide range of values can be used depending on the particular application.

Since the chain extension technology forms linear, high molecular weight silicone polymers during cure, the base silicone oil can have a wide range of molecular weights. However, silicone oils with low molecular weights may render PTIMs that are easier to use due to their reduced viscosity before cure. Moreover, the use of low molecular weight silicone oil provides improved wetting of fillers due to the reduced entropy loss upon becoming confined to the surface of the filler. This may permit higher filler loadings, which provide higher bulk thermal conductivities.

The fillers, as mentioned above, may include metals, such as aluminum, silver, copper, and the like; ceramics, such as aluminum nitride, aluminum oxide, zinc oxide, boron nitride, aluminum nitride, and the like; silver coated aluminum, carbon fibers, alloys and any combinations thereof. Fillers with larger average filler sizes provide higher bulk thermal conductivities; however, they also give higher bond line thicknesses that reduce thermal performance. Therefore, the average particle size may be in a range that balances these factors for a high performance thermal interface material. Typically, the average particle size is less than about 300 microns. In one embodiment, the average particle size is less than approximately 30 microns. The fillers are first wetted and then mixed with the silicones.

The cure time and temperature can be controlled by the choices of catalyst selection, catalyst concentration, and the optional use of catalyst inhibitors and retarders. In general, the chain extenders react more quickly than typical silicone crosslinkers, and, therefore, typically require modifications of the catalyst selection, concentration, inhibitors, etc. in order to provide a balance of reactivity during cure and sufficiently long shelf life and pot life. Other additives including, but not limited to, catalysts for the curing reaction, coupling agents for the filler, adhesion promoters, coloring agents, and other additives may also be used.

The compositions of this invention may be used as thermal interface materials in electronic packages that require the removal of heat. The packages may have a variety of form factors including but not limited to: land grid arrays, pin grid arrays, ball grid arrays, and ball grid arrays with pinned interposers. The compositions are especially useful as the thermal interface material between the die and the IHS of flip-chip packages; however, they can be used in a variety of applications in which a thermal interface material is needed between the chip and the heat removal hardware such as heat fins, fans, vapor chambers, and the like. The improved thermal performance of the described PTIM may be validated on microelectronic packages. Microelectronic packages may be assembled using the described PTIM to connect a silicon die to an integrated heat spreader (IHS). The package formed of the die, attached to a substrate, and the IHS attached to the die and the substrate may then be cured by baking at e.g. 165° C. The finished package may then be subjected to mechanical and thermal stresses when it is assembled into an electronic device and in use. For such a package, the thermal resistance through the improved PTIM is lower before and after reliability thermal testing.

Using the techniques described herein a two-fold increase in thermal conductivity and a lower contact resistance may be obtained with less voiding. The described embodiments involve a unique filler size and shape distributions. The filler loading is also unique and can be observed through thermogravimetric analysis (TGA). The silicone material includes silicon, carbon, and oxygen atoms in a silicone polymer matrix. This silicone polymer matrix shows unique vibrational modes attributable to Si—O bonds and Si—C bonds.

Package Formed Using PTIM

Figure 6:
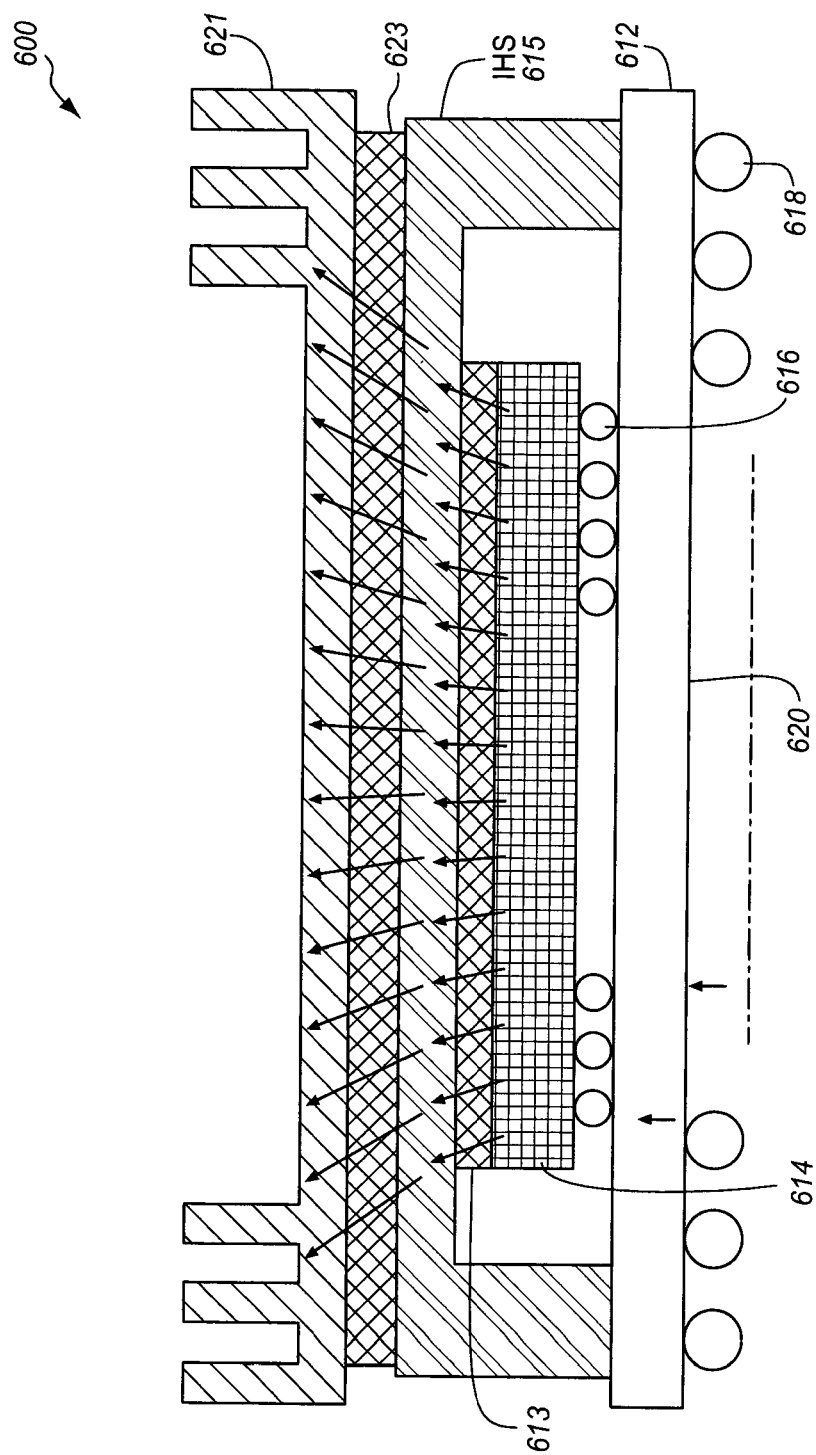
FIG. 6 is a cross-sectional diagram of a microelectronic package having a PTIM according to an embodiment of the invention.

FIG. 6 is a cross-sectional side view diagram illustrating an integrated circuit package 600 in which one embodiment of the invention can be practiced. In one embodiment, the integrated circuit package 600 includes a dielectric substrate 612 with conductive paths that are electrically coupled to an integrated circuit 614, such as a semiconductor die, by solder bumps 616 used in a process commonly referred to as controlled collapsed chip connection (C4). A curable TIM 613, such as the PTIM described herein, is used as a thermal material between the integrated circuit or die 614 and an integrated heat spreader (IHS) 615.

The integrated circuit package 600 may include a plurality of solder balls 618 that are attached to a bottom surface 620 of the substrate 612. The solder balls 618 may be reflowed to attach the integrated circuit package 600 to a printed circuit board (not shown). The substrate 612 may contain routing traces, surface pads, power/ground planes and vias, etc., which electrically connect the solder balls 618 with the solder bumps 616. Although solder balls 618 are shown and described any of a variety of other connection may be used including pins, lands and pad.

The integrated circuit 614 generates heat, which is removed from the integrated circuit package 600 through the IHS. The IHS 615 is thermally coupled to the integrated circuit 614 by the PTIM 613 to absorb heat from the integrated circuit 614 and spread it across the larger surface of the IHS. The heat spreader 615 may comprise metal and metal alloys optionally with a coating of another metal or may comprise a thermally conductive composite material. The PTIM 613 is be placed between the integrated circuit 614 and the heat spreader 615 to connect the two pieces together, absorb mechanical stress from thermal cycling and conduct heat.

A heat sink 621 may be attached to the heat spreader 615 to enhance heat removal. In the illustrated example, the heat sink is a metal plate with a plurality of fins, however, liquid coolers, heat pipes, or larger plates may be used. To decrease the thermal impedance between the IHS 614 and the heat sink 621, another thermal interface material 623 is applied and placed between the IHS 615 and the heat sink 621. This thermal interface material 623 may be the same or different from the PTIM 641 that is in contact with the die. Other suitable materials may include a thermal grease and a phase change material depending on the nature of the heat sink. The arrows show the flow of heat from the die, through the PTIM to the IHS and then from the IHS, through the TIM to the heat sink. Increasing the thermal conductivity of the thermal interface materials increases the rate of heat flow and allows the die to operate at a lower temperature.

The package 600 is shown as an example. A variety of other simpler or more complex packages may be used. There may be more or fewer dies in the package and more or fewer substrates including translation and interposer substrates. The package may be designed for or include a socket or attach directly to a system board or other surface. The dies may by flipped, or upright or place in any other position. While the application refers to a semiconductor die, a micromechanical, or optical die may be used instead. The die may be silicon, ceramic, lithium niobate, gallium arsenide, or any other material or combination thereof. While the heat spreader is shown as surrounding and sealing the die against the package substrate, it may take other forms and may expose a portion of the die to ambient or another controlled environment.

To assemble the package, a grid of C4 pads are pasted to the substrate and 612 the die 614 is placed onto the solder pads 616. The assembly is passed through a solder reflow furnace to melt the C4 pads and establish a solder connection between the die and the substrate. A PTIM 613 is applied to the heat spreader 615 or any other heat sink and the assembly is passed through the curing oven to cure the PTIM and bond the die to the heat spreader. PTIM or another adhesive may also be applied where the heat spreader contacts the package. In some cases a dielectric adhesive may be preferred. The finished package may then be attached to a printed circuit board or a socket or any other device with solder balls or a fixture. The heat sink may be attached with an adhesive TIM or a mechanical clamp or in any of a variety of other ways depending on the particular implementation.

Figure 7:
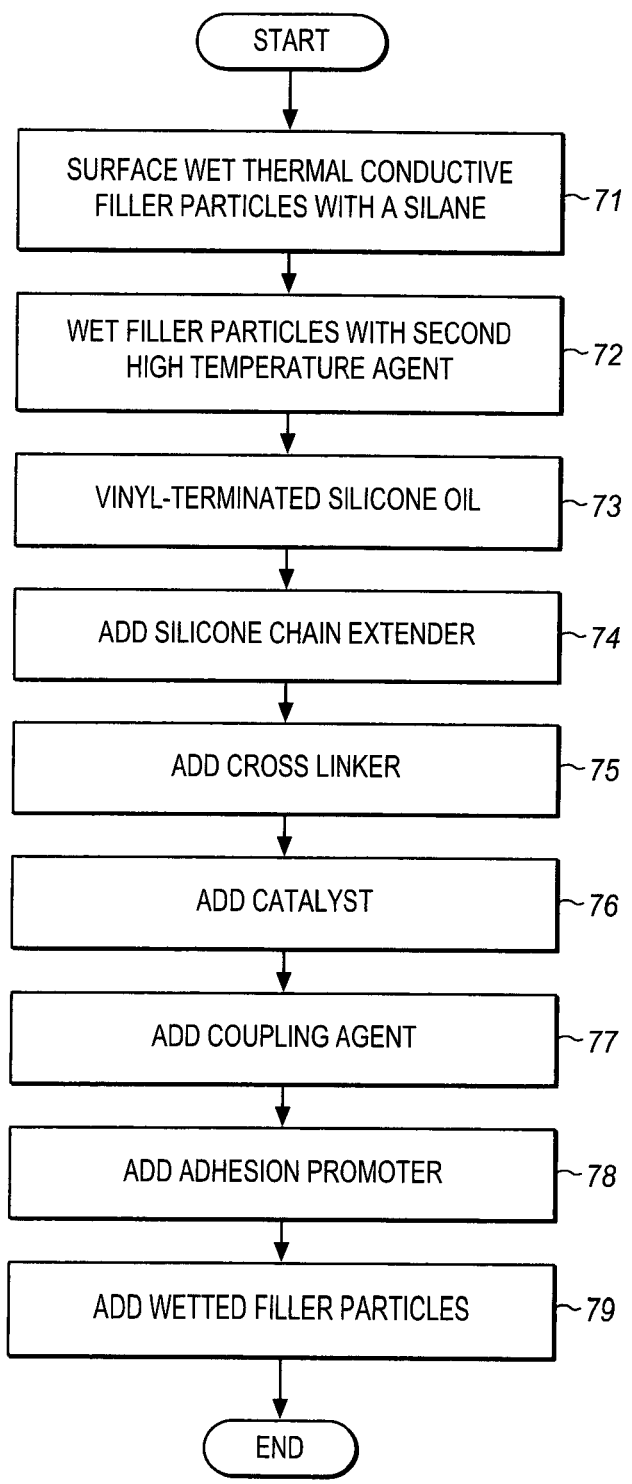
FIG. 7 is a process flow diagram of forming a PTIM according to an embodiment of the invention.

FIG. 7 is a process flow diagram of a method of making a thermal interface material as described herein. At 71, thermally conductive metal filler particles are wetted with a silane. Optionally, there may be two wetting agents at 72 or just one, depending on the particular implementation. To create the material, the base ingredient is a vinyl-terminated silicone oil at 73. To this a number of different additional materials may be added together with the filler. Some of these are necessary and others are not, while substitutions may be made for many of the possible ingredients. A silicone chain extender is optionally added at 74. At least one cross linker is optionally added at 75. At least one catalyst for curing reaction is optionally added at 76. At least one coupling agent for the filler is added at 77. At least one adhesion promoter is added at 78. At 79, the wetted filler particles are added to comprise at least 85% by weight of the material.

The thermal conductive filler particles may be made of a variety of different metals including one or more of aluminum, silver, copper, aluminum nitride, aluminum oxide, zinc oxide, boron nitride, aluminum nitride, silver coated copper, silver coated aluminum, and carbon fibers, and alloys and mixtures thereof.

The surface wetting may be done using a single agent that has a boiling point above the cure temperature of the material. Alternatively, two wetting agents may be used. A first wetting agent may have a boiling point below the cure temperature of the material and the second wetting agent may have a boiling point above the cure temperature of the material. The first agent is applied in a quantity sufficient to substantially be adsorbed by the filler particles with substantially no excess first agent that is not adsorbed. The second agent may be applied in a quantity sufficient to reduce the viscosity of the material. The second agent may be formed of a variety of different materials including a silane with an attached alkyl chain.

Figure 8:
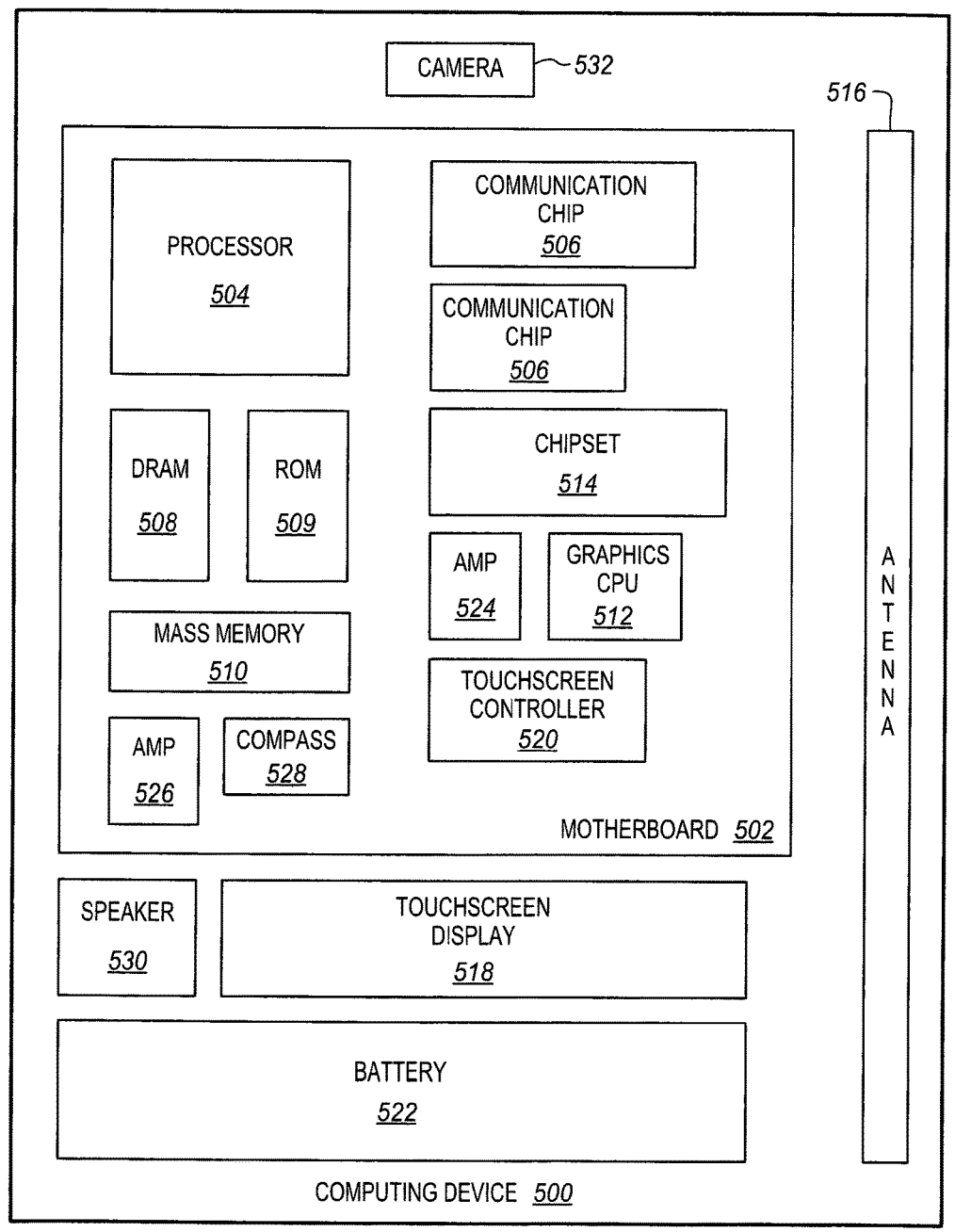
FIG. 8 is a block diagram of a computing device incorporating a microelectronic package according to an embodiment of the invention.

FIG. 8 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as hard disk drive) 510, compact disk (CD) (not shown), digital versatile disk (DVD) (not shown), and so forth). These components may be connected to the system board 502, mounted to the system board, or combined with any of the other components.

The communication chip 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor, memory devices, communication devices, or other components include one or more dies that are packaged using a PTIM as described herein. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a polymer thermal interface material having a vinyl-terminated silicone oil, a silicone chain extender, and a thermally conductive filler comprising at least 85% by weight of the material, and comprising surface wetted particles with a range of shapes and sizes. In some embodiments the filler particles have average diameters of from 8 to 10 μm, and/or the filler particles comprise metal. In some embodiments, the surface wetted particles are wetted with agents comprising silanes and/or the surface wetted particles are wetted with polymeric chemical agents containing acetoxy groups.

In some embodiments, the material has a cure temperature and the surface wetted particles are wetted with agents having a boiling point below a cure temperature of the material.

In some embodiments, the material has a cure temperature and the surface wetted particles are wetted first with a first agent having a boiling point below a cure temperature of the material and then with a second agent having a boiling point above a cure temperature of the material. The first agent may be applied in a quantity sufficient to substantially be adsorbed by the filler particles with substantially no excess first agent that is not adsorbed. The second agent may be applied in a quantity sufficient to reduce the viscosity of the material. The second agent may comprise a silane with an attached alkyl chain.

In some embodiments the material includes a silicone crosslinker in the form of a random co-polymer having at least three silicone-hydrogen bonds (Si—H). In some embodiments the silicon chain extender is a hydrogen terminated silicone oil.

The conductive filler particles may include one or more of aluminum, silver, copper, aluminum nitride, aluminum oxide, zinc oxide, boron nitride, aluminum nitride, silver coated copper, silver coated aluminum, and carbon fibers, and alloys and mixtures thereof.

Some embodiments pertain to a method of making a thermal interface material by surface wetting a plurality of thermal conductive filler particles with a silane, and combining a vinyl-terminated silicone oil, a silicone chain extender, and the wetted filler particles wherein the wetted filler particles are at least 85% by weight of the material. In some embodiments at least one catalyst is added for curing reaction. In some embodiments at least one coupling agent is added for the filler. In some embodiments, at least one adhesion promoter is added.

In some embodiments, the material has a cure temperature and first wetting is with a first agent having a boiling point below a cure temperature of the material and a second agent having a boiling point above a cure temperature of the material.

In some embodiments, the first agent is applied in a quantity sufficient to substantially be adsorbed by the filler particles with substantially no excess first agent that is not adsorbed. In some embodiments, the second agent is applied in a quantity sufficient to reduce the viscosity of the material. In some embodiments, the second agent comprises a silane with an attached alkyl chain.

Some embodiments pertain to a semiconductor package including a substrate, a semi conductor die coupled to the substrate, a heat spreader coupled to the die, and a thermal interface material between the die and the heat spreader to mechanically and thermally couple the heat spreader to the die, the thermal interface material has a vinyl-terminated silicone oil, a silicone chain extender, and a thermally conductive filler comprising at least 85% by weight of the material, and comprising surface wetted particles with a range of shapes and sizes.

In some embodiments, the thermal interface material further comprises at least one silicone crosslinker as a random co-polymer comprising at least three silicone-hydrogen bonds (Si—H).

In some embodiments the package includes a first plurality of solder bumps coupling the substrate to the die; and a second plurality of solder bumps for coupling the substrate to a system.

What is claimed is:

1. A polymer thermal interface material having a cure temperature, the material comprising:
   a vinyl-terminated silicone oil, the vinyl-terminated silicone oil comprising Si-vinyl groups;
   a silicone chain extender comprising terminal silyl hydride (Si—H) functional groups;
   a silicon crosslinker comprising silyl hydride (Si—H) functional groups, wherein the molar ratio of total Si—H functional groups from the silicon chain extender and the silicon crosslinker to the Si-vinyl groups of the vinyl-terminated silicone oil in the thermal interface material is in the range of 0.8-1.2, and wherein a total composition of the thermal interface material comprises 3-15% by weight of the vinyl-terminated silicon oil, 0.1-3% of the silicon crosslinker, and 0.1-3% of the silicon chain extender; and
   a thermally conductive filler comprising at least 85 percent by weight of the material, and comprising surface wetted particles with a range of shapes and sizes,
   wherein the surface wetted particles comprise a first agent having a boiling point below the cure temperature of the material and a second agent having a boiling point above the cure temperature of the material,
   wherein the first agent is formed as a layer of adsorbed molecules on a surface of the filler particles and is present in a quantity sufficient to be adsorbed by and coat the filler particles with no excess first agent that is not adsorbed,
   wherein the second agent is applied on the layer in a quantity sufficient to reduce the viscosity of the material, and
   wherein the thermal interface material has a volatile content less than 0.2 weight percent at 150° C.

2. The material of claim 1, wherein the average diameter of the filler particles is within a range of from 8 to 10 μm.

3. The material of claim 1, wherein the filler particles comprise metal.

4. The material of claim 1, wherein the surface wetted particles are wetted with agents comprising silanes.

5. The material of claim 4, wherein the surface wetted particles are wetted with polymeric chemical agents containing surface-reactive groups such as methoxy or chloro groups.

6. The material of claim 1, wherein the silicone crosslinker in the form of a random co-polymer having at least three silicone-hydrogen bonds (Si—H).

7. The material of claim 1 wherein the conductive filler particles comprise one of aluminum, silver, copper, aluminum nitride, aluminum oxide, zinc oxide, boron nitride, aluminum nitride, silver coated copper, silver coated aluminum, and carbon fibers, and alloys and mixtures thereof.

8. A method of making a thermal interface material, the material having a cure temperature, the method comprising:
   surface wetting a plurality of thermal conductive filler particles with a first agent having a boiling point below the cure temperature of the material and then with a second agent having a boiling point above the cure temperature of the material,
   wherein the first agent is formed as a layer of adsorbed molecules on a surface of the filler particles,
   wherein the first agent is applied in a quantity sufficient to be adsorbed by and coat the filler particles with no excess first agent that is not adsorbed, and
   wherein the second agent is applied on the layer in a quantity sufficient to reduce the viscosity of the material;
   combining a vinyl-terminated silicone oil comprising Si-vinyl groups, a silicone chain extender comprising terminal silyl hydride (Si—H) functional groups, a silicon crosslinker comprising silyl hydride (Si—H) functional groups, wherein the molar ratio of total Si—H functional groups from the silicon chain extender and the silicon crosslinker to the Si-vinyl groups of the vinyl-terminated silicone oil in the thermal interface material is in the range of 0.8-1.2, and wherein a total composition of the thermal interface material comprises 3-15% by weight of the vinyl-terminated silicon oil, 0.1-3% of the silicon crosslinker, and 0.1-3% of the silicon chain extender, and the wetted filler particles wherein the wetted filler particles are at least 85 percent by weight of the material, and wherein the thermal interface material has a volatile contentless than 0.2 weight percent at 150° C.

9. The method of claim 8, further comprising combining at least one coupling agent for the filler.

10. The method of claim 8, further comprising combining at least one adhesion promoter.

11. The method of claim 8, wherein the thermal conductive filler particles comprise one of aluminum, silver, copper, aluminum nitride, aluminum oxide, zinc oxide, boron nitride, aluminum nitride, silver coated copper, silver coated aluminum, and carbon fibers, and alloys and mixtures thereof.

12. A semiconductor package comprising:
   a substrate;
   a semiconductor die coupled to the substrate; a heat spreader coupled to the die; and
   a thermal interface material between the die and the heat spreader to mechanically and thermally couple the heat spreader to the die, the thermal interface material having a cure temperature and comprising:
   a vinyl-terminated silicone oil, the vinyl-terminated silicone oil comprising Si-vinyl groups;
   a silicone chain extender comprising terminal silyl hydride (Si—H) functional groups;
   a silicon crosslinker comprising silyl hydride (Si—H) functional groups, wherein the molar ratio of total Si—H functional groups from the silicon chain extender and the silicon crosslinker to the Si-vinyl groups of the vinyl-terminated silicone oil in the thermal interface material is in the range of 0.8-1.2, and wherein a total composition of the thermal interface material comprises 3-15% by weight of the vinyl-terminated silicon oil, 0.1-3% of the silicon crosslinker, and 0.1-3% of the silicon chain extender; and a thermally conductive filler comprising at least 85 percent by weight of the material, and comprising surface wetted particles with a range of shapes and sizes, wherein the surface wetted particles comprise a first agent having a boiling point below the cure temperature of the material and a second agent having a boiling point above the cure temperature of the material, wherein the first agent is formed as a layer of adsorbed molecules on a surface of the filler particles and is present in a quantity sufficient to be adsorbed by and coat the filler particles with no excess first agent that is not adsorbed, wherein the second agent is applied on the layer in a quantity sufficient to reduce the viscosity of the material, and wherein the thermal interface material has a volatile content less than 0.2 weight percent at 150° C.

13. The package of claim 12, wherein the silicone crosslinker is a random co-polymer comprising at least three silicone-hydrogen bonds (Si—H).

* * * * *